US008865591B2

(12) United States Patent
Tamari et al.

(10) Patent No.: US 8,865,591 B2
(45) Date of Patent: Oct. 21, 2014

(54) N-TYPE CONTACT ELECTRODE FORMED ON AN N-TYPE SEMICONDUCTOR LAYER AND METHOD OF FORMING SAME USING A SECOND METAL ELECTRODE LAYER HEAT-TREATED AFTER BEING FORMED ON A FIRST, HEAT-TREATED METAL ELECTRODE LAYER

(75) Inventors: Naoki Tamari, Tsukuba (JP); Toru Kinoshita, Tsukuba (JP)

(73) Assignee: Tokuyama Corporation, Yamaguchi (JP)

( * ) Notice: Subject to any disclaimer, the term of this patent is extended or adjusted under 35 U.S.C. 154(b) by 258 days.

(21) Appl. No.: 13/517,260

(22) PCT Filed: Dec. 22, 2010

(86) PCT No.: PCT/JP2010/073191

§ 371 (c)(1),
(2), (4) Date: Jun. 28, 2012

(87) PCT Pub. No.: WO2011/078252

PCT Pub. Date: Jun. 30, 2011

(65) Prior Publication Data

US 2012/0258591 A1    Oct. 11, 2012

(30) Foreign Application Priority Data

Dec. 22, 2009  (JP) ................................ 2009-290341
May 31, 2010  (JP) ................................ 2010-123954

(51) Int. Cl.
*H01L 21/44*   (2006.01)
*H01L 29/45*   (2006.01)
(Continued)

(52) U.S. Cl.
CPC ............... *H01L 29/452* (2013.01); *H01L 33/32* (2013.01); *H01L 33/40* (2013.01); *H01L 29/2003* (2013.01); *H01S 5/0425* (2013.01); *H01S 5/32341* (2013.01); *H01L 21/28575* (2013.01)
USPC .................................. 438/654; 257/E21.158

(58) Field of Classification Search
CPC . H01L 29/452; H01L 21/28575; H01L 33/32; H01L 29/2003; H01L 33/40; H01S 5/0425; H01S 5/32341
USPC .................................. 438/654; 257/E21.158
See application file for complete search history.

(56) References Cited

U.S. PATENT DOCUMENTS 4,989,065 A * 1/1991 Tsuchimoto et al. ......... 257/750
5,077,599 A * 12/1991 Yano et al. .................... 257/753

(Continued)

FOREIGN PATENT DOCUMENTS

JP    61089664 A    5/1986
JP    H07221103 A   8/1995

(Continued)

OTHER PUBLICATIONS

Notification of Transmittal of Translation of the International Preliminary Report on Patentability, International Application No. PCT/JP2010/073191, dated Jul. 12, 2012.

(Continued)

*Primary Examiner* — Stephen W Smoot
*Assistant Examiner* — Vicki B Booker
(74) *Attorney, Agent, or Firm* — Cahn & Samuels, LLP

(57) ABSTRACT

A method for forming an n-type contact electrode, which includes an n-type nitride semiconductor such as $Al_xIn_yGa_zN$ (with x, y, and z being rational numbers that sum to 1.0 and fulfill the relations $0<x\leq1.0$, $0\leq y\leq0.1$, and $0\leq z<1.0$), includes: a step in which a first electrode metal layer including at least one metal selected from titanium, vanadium, and tantalum is formed on a layer of the aforementioned n-type semiconductor and then heat-treated at a temperature between 800° C. and 1200° C.; and a step in which a second electrode metal layer is formed on top of the first electrode metal layer and then heat-treated at a temperature between 700° C. and 1000° C. The second electrode metal layer contains a layer comprising a metal, such as aluminum, that has a work function between 4.0 and 4.8 eV and a resistivity between $1.5\times10^{-6}$ Ω·cm and $4.0\times10^{-6}$ Ω·cm.

8 Claims, 4 Drawing Sheets

(51) Int. Cl.
  *H01L 21/285* (2006.01)
  *H01L 33/32* (2010.01)
  *H01L 33/40* (2010.01)
  *H01L 29/20* (2006.01)
  *H01S 5/042* (2006.01)
  *H01S 5/323* (2006.01)

(56) References Cited

U.S. PATENT DOCUMENTS

| | | | | |
|---|---|---|---|---|
| 5,767,007 | A | * | 6/1998 | Uchibori et al. .............. 438/604 |
| 5,924,002 | A | * | 7/1999 | Tojyo et al. .................... 438/602 |
| 6,329,716 | B1 | * | 12/2001 | Nido et al. .................... 257/745 |
| 7,141,498 | B2 | | 11/2006 | Malhan et al. |

FOREIGN PATENT DOCUMENTS

| | | |
|---|---|---|
| JP | 7254733 A | 10/1995 |
| JP | 2006261624 A | 9/2006 |
| JP | 2009188215 A | 8/2009 |

OTHER PUBLICATIONS

English abstract of JP7254733 (A), Nichia Kagaku Kogyo KK. Oct. 3, 1995.
English abstract of JP2009188215 (A), Toyoda Gosei KK. Aug. 20, 2009.
English abstract of JP61089664 (A), Fujitsu LTD. May 7, 1986.
English abstract of JP2006261624 (A), Denso Corp, Univ. of New Castle. Sep. 28, 2006.
Michaelson, Herbert B., "The Work Function of the Elements and Its Periodicity", Journal of Applied Physics, Nov. 1977, vol. 48, No. 11, 4729-4733.
Jan, Jasoon, et al., "Electronic Transport Mechanism for Nonalloyed Ti-Based Ohmic Contacts to n-AlGaN", Journal of Applied Physics, 2006, vol. 100, 046106-1 to -3.
Miller, M.A., et al., "Ti/Al/Au and V/Al/V/Au Contacts to Plasma-Etched n-Al0.58GA0.42N", Journal of Electronic Materials, 2008, vol. 37, No. 5, 564-568.
Tilka, V., et al., "Electric and Morphology Studies of Ohmic Contacts on AlGaN/GaN", MRS Proceedings, Jan. 1, 2000, pp. 1-6, vol. 622.
Abhishek, Motayed, et al., "Electrical, Microstructural, and Thermal Stability Characteristics of Ta/Ti/Ni/Au Contacts to n-GaN", Journal of Applied Physics, Feb. 1, 2004, pp. 1516-1524, vol. 95, No. 3.
Feng, Q., et al., "The Improvement of Ohmic Contact of Ti/Al/Ni/Au to AlGaN/GaN/ HEMT by Multi-Step Annealing Method", Solid State Electronics, Sep. 1, 2009, pp. 955-958, vol. 53, No. 9.
Extended European Search Report, EP 10839482.6, dated Mar. 27, 2014.
English abstract of JPH07221103 (A)—Aug. 18, 1995.

* cited by examiner

- Au layer
- Al layer
- Ti layer
- n-type semiconductor layer
- sapphire substrate

PRIOR ART

←n-type semiconductor layer (a) cross section of TEM image (b) Ti distribution (c) Al distribution (d) N distribution (e) Au distribution

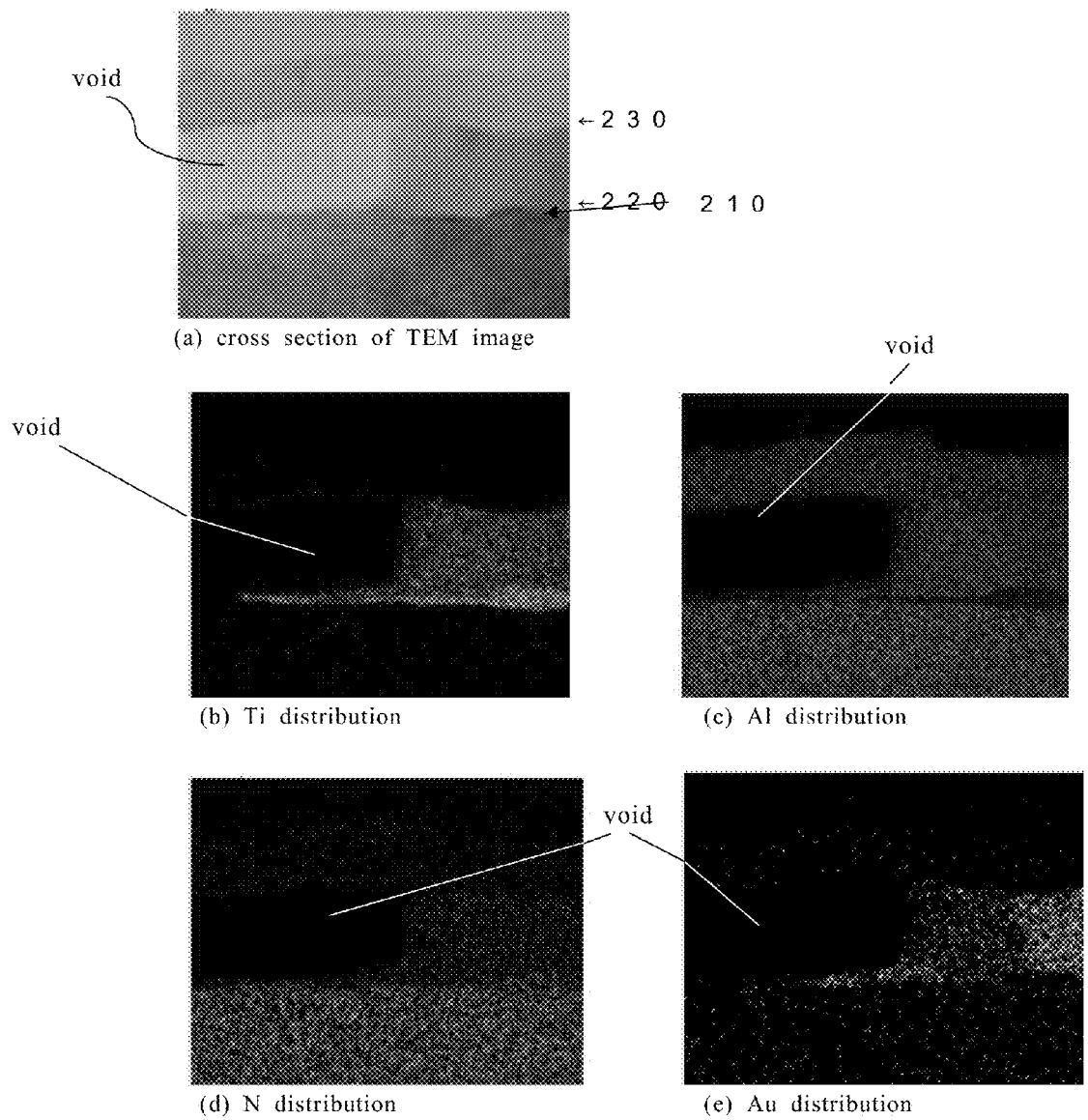

N-TYPE CONTACT ELECTRODE FORMED ON AN N-TYPE SEMICONDUCTOR LAYER AND METHOD OF FORMING SAME USING A SECOND METAL ELECTRODE LAYER HEAT-TREATED AFTER BEING FORMED ON A FIRST, HEAT-TREATED METAL ELECTRODE LAYER

This application is a U.S. national stage application of PCT/JP2010/073191 on Dec. 22, 2010 which claims priority of Japanese patent document 2009-290341 filed on Dec. 22, 2009 and of Japanese patent document 2010-123954 filed on May 31, 2010, the entireties of which are incorporated herein by reference.

TECHNICAL FIELD

The present invention relates to a n-type contact electrode comprising a group III nitride semiconductor and a method forming the same.

BACKGROUND OF THE INVENTION

The contact between an electrode and the n-type GaN layer of a group III nitride semiconductor allows obtaining relatively good low contact resistance value by the constitution of the metals such as Ti/Al/Au or so. For example, the method of forming n-type contact electrode laminating the metal having a higher melting point than Al by sequentially forming Ti and Al on the GaN layer of the n-type semiconductor layer as the n-type contact electrode (for example, refer to Patent document 1). Patent document 1 recites Au, Ti, Ni, Pt, W, Mo, Ta and Cu or so as the metal having higher melting point than Al, and it describes that Au which has good bonding with the Ti and Al is particularly good.

In said Patent document 1, the electrode laminating Ti layer, Al layer, Au layer on the n-type GaN layer in said order is shown as the specific example of the n-type contact electrode. The constitution of said n-type contact electrode is shown in FIG. 1. Such n-type contact electrode is formed by the following steps. Specifically, in the Patent document 1, as for the method for forming the n-type contact electrode, the steps of carrying out the dry etching to the n-type GaN layer (the contact layer), then sequentially forming the electrode metal made of Ti, Al, Au on said contact layer, and finally carrying out the heat treatment at 400° C. or higher, specifically 600° C., is described. By forming the contact electrode on the n-type GaN layer by above mentioned method, it is shown that a good contact resistance value can be obtained and the contact electrode having high bonding strength with the n-type GaN layer can be obtained.

PRIOR ART DOCUMENTS

Patent Articles

[Patent Article 1] Japanese Unexamined Patent Publication No. H07-221103

According to the above described method, in case the n-type semiconductor layer is a GaN layer, the n-type contact electrode having good contact resistance value is obtained.

However, according to the present inventors, in the group III nitride semiconductor, if the composition of the n-type semiconductor layer on which the electrode is formed is changed, even though the n-type contact electrode is made by a conventional method, a good contact resistance value may not be obtained.

For example, in order to realize a light-emitting diode and laser diode emitting the light in the deep violet range having wavelength of 300 nm or less, and also having high light output, the n-type semiconductor layer comprising the group III nitride including Al becomes necessary. The n-type contact electrode formed according to the above method on the n-type semiconductor layer comprising such group III nitride including Al, had a good contact resistance value cannot be obtained when the electric current-voltage characteristic was measured.

The reason for this is because the group III nitride single crystal including Al has small electron affinity than GaN, and along with that the Schottky barrier (defined by the subtracting the electron affinity of the n-type semiconductor from the work function of the metal) tends to be easily generated when connecting the metal which becomes the electrode. That is, the electron affinity of GaN is about 2.7 eV which is relatively large, and since the metal which does not allow the Schottky barrier to be generated is present, even if the Schottky barrier is generated, the value thereof is relatively small. On the contrary to this, as it is also obvious from about 0.6 eV of the electron affinity of AlN which is relatively small, the electron affinity of the group III nitride single crystal particularly including Al in high concentration is small, and the metal having small work function which does not form the Schottky barrier does not exist. Therefore, the generation of the Schottky barrier can not be avoided in case the metals are connected, thus in order to accomplish the connection to be an ohmic contact or as close as possible to the ohmic contact, some sort of ideas such as to select the suitable metal and also to make the width of the electron lacking layer to be thin by regulating the boundary state between the n-type semiconductor metal are needed; thereby making a effective tunnel effect or so. Also, as other factor, it is speculated that a good contact resistance value cannot be obtained since the oxidized membrane which become as the insulation layer is easily formed on the surface as Al is included in the n-type contact layer.

Therefore, the object of the present invention is to provide a method for forming the n-type semiconductor layer of the group III nitride single crystal, and the n-type contact electrode capable of obtaining a good contact resistance. Among these, the object is to provide a method for forming the n-type contact electrode capable of obtaining a good contact resistance in the n-type semiconductor layer comprising the group III nitride including Al and having small electron affinity such as $Al_xIn_yGa_zN$ (x, y, and z are rational numbers satisfying $0<x\leq1.0$, $0\leq y\leq0.1$, $0\leq z<1.0$; and $x+y+z=1.0$).

SUMMARY OF THE INVENTION

The present inventors have carried out a keen examination in order to solve the above object. As a result, the present inventors have found that the contact resistance becomes small in some case, such as by forming the titanium metal layer as the first electrode layer on the n-type semiconductor layer then carrying out the heat treatment at the predetermined temperature, and after said heat treatment, further carrying out the heat treatment again after forming the aluminum layer as the second electrode layer, although there still remain the problem of the repeatability. Also, by carrying out further examination based on said founding, the present inventors have found that the same effect can be obtained when the first layer is formed by vanadium or tantalum, followed by forming the second electrode layer by the metal having the work function of 4.0 eV to 4.8 eV and the specific resistance of $1.5\times10^{-6}$ Ω·cm to $4.0\times10^{-6}$ Ω·cm. Moreover, the present inventors have found that when the second electrode layer is formed from a multilayer structure including the metal layer comprising a metal having the work function of 4.0 eV to 4.8 eV and the specific resistance of $1.5 \times 10^{-6}$ Ω·cm to $4.0 \times 10^{-6}$ Ω·cm and metal layer comprising gold and/or platinum; the repeatability is improved and the contact resistance can be made small. Thereby the present invention was achieved.

That is the present invention is a method for forming a n-type contact electrode on a n-type semiconductor layer of a group III nitride single crystal, wherein said method for forming the n-type contact electrode includes the steps of;

carrying out a heat treatment at a temperature of 800° C. or higher and 1200° C. or less after forming a first electrode metal layer comprising a metal layer of at least one selected from a group consisting of Ti, V, and Ta on said n-type semiconductor layer, and carrying out a heat treatment at a temperature of 700° C. or higher and 1000° C. or less after forming a second electrode metal layer including a highly conductive metal layer of metals having a work function of 4.0 eV to 4.8 eV, and a specific resistance of $1.5 \times 10^{-6}$ Ω·cm to $4.0 \times 10^{-6}$ Ω·cm on said first electrode metal layer.

Among these, the present invention can particularly suitably used when said n-type semiconductor layer is formed from the group III nitride single crystal satisfying a composition shown by $Al_xIn_yGa_zN$ (x, y, and z are rational numbers satisfying $0<x\le1.0$, $0\le y\le0.1$, $0\le z<1.0$; and x+y+z=1.0).

Also, in the present invention, said second electrode metal layer preferably has a multilayer structure of two or more layers, and preferably includes the adherence metal layer comprising a metal of at least one selected from a group consisting of Ti, V and Ta, further preferably said adherence metal layer is placed at the lowest layer of said multilayer structure. By doing so, the bonding between the first electrode metal layer and the second electrode metal layer at after the second heat treatment is enhanced, and the reliability is improved. Also, the second electrode metal layer preferably comprises multilayer structure including the noble metal layer of Au and/or Pt, and said noble metal layer is preferably placed at the upper layer than said highly conductive metal layer. By placing said noble metal layer as such, the contact resistance can be stably lowered, and the ohmic contact can be accomplished. The second electrode metal layer has a multilayer structure including said adherence metal layer, said highly conductive metal layer and said noble metal layer, and said adherence metal layer is placed at the lowest layer of said multilayer structure, and said noble metal layer is preferably placed on upper layer than said highly conductive metal layer.

Also, in the present invention, the temperature of the heat treatment after forming the second electrode metal layer is preferably lower than the temperature of the heat treatment after forming the first electrode metal layer.

Also, in the method of the present invention, before forming said first electrode metal layer, the step of the surface treating said n-type semiconductor layer by alkaline solution is included.

Further, the present invention is the group III nitride semiconductor comprising the n-type contact electrode formed by above mentioned method.

The electrode according to the present invention is the n-type contact electrode formed on the n-type semiconductor layer of the group III nitride single crystal, wherein the electrode comprises a first layer formed on the n-type semiconductor layer and has a main component of a metal at least one selected from the group consisting of Ti, V and Ta, and the second layer formed on said first layer and includes the metal of at least one selected from the group consisting of Ti, V and Ta, the metal having a work function of 4.0 eV to 4.8 eV and a specific resistance of $1.5 \times 10^{-6}$ Ω·cm to $4.0 \times 10^{-6}$ Ω·cm, and Au and/or Pt. The n-type contact electrode wherein the metal having a work function of 4.0 eV to 4.8 eV and a specific resistance of $1.5 \times 10^{-6}$ Ω·cm to $4.0 \times 10^{-6}$ Ω·cm or Au and/or Pt are localized in the first layer side is particularly preferable since that low contact resistance with good repeatability can be stably obtained.

According to the present invention, in the n-type semiconductor layer of group III nitride and the n-type contact electrode, the contact electrode capable of obtaining a good contact resistance can be obtained.

Among these, the method of the present invention can form the n-type contact electrode capable to obtain a good contact resistance value even in case of n-type semiconductor layer of group III nitride satisfying the composition of $Al_xIn_yGa_zN$ (x, y, and z are rational numbers satisfying $0<x\le1.0$, $0\le y\le0.1$, $0\le z\le1.0$; particularly of $0.5\le x\le1.0$, $0\le y\le0.1$, $0\le z\le0.5$; and x+y+z=1.0). Therefore, the group III nitride semiconductor formed with the n-type contact electrode according to the method of the present invention can be suitably used to the deep ultraviolet emitting device.

The mechanism allowing obtaining such a superior effect by the method of the present invention is not necessarily clear; however from the result of the electron microscope observation, the present inventors speculates the following reasons. That is, in regards with the reasons of attaining the low contact resistance, since Ti, V, and Ta constituting the first electrode metal layer has the reactivity against the group III nitride containing Al, the reaction takes place by carrying out the heat treatment at the high temperature of 800° C. or higher and 1200° C. or less; thereby the extremely thin layer (the reactive layer) of these metal nitrides are formed at the interface (the formation reaction of the metal nitrides) which seems to be the main cause. When such reaction layer is formed at the boundary, it is thought that the tunnel effect easily occur because the Schottky barrier is lowered or the width thereof is made narrower (the thickness of the electron lacking layer is made thin).

Further, in the method of the present invention, by carrying out the second heat treatment by forming the highly conductive metal layer of a specific highly conductive metal as the second electrode metal layer after the first heat treatment, the boundary condition obtained at the first heat treatment becomes in a better condition and also the highly conductive metal connects in good condition, thereby the contact resistance is thought to be lowered. Note that, when the second electrode metal layer and the second heat treatment are not carried out, the boundary is not sufficiently in a good condition. Furthermore, since the above mentioned metal such as Ti or so has a large specific resistance, the contact resistance can not be effectively reduced. Also, after forming the first electrode metal layer, in case the second electrode metal layer is formed without the first heat treatment and then carried out with the heat treatment, the metal constituting the second electrode metal layer is diffused during the heat treatment and contacts with the n-type semiconductor layer, thus a good boundary condition cannot be obtained and it becomes difficult to lower the contact resistance. For example, particularly, since the noble metal such as Au or Pt has high diffusibility at a high temperature, when the second heat treatment is only carried out without carrying out the first heat treatment, these noble metal moves by diffusing to the boundary before the above reaction (the formation reaction of the metal nitride) is sufficiently carried out; thereby it directly contact with the n-type semiconductor thus the contact resistance cannot be lowered. In case the first heat treatment is carried out, the above reaction is carried out sufficiently and "the layer including the metal nitride such as titanium nitride or so" is sufficiently formed which function as the barrier layer; thus the above mentioned noble metals and the highly conductive metal does not directly contact with the n-type semiconductor during the second heat treatment thereby the low contact low resistance was accomplished.

Also, according to the present invention, by making the second electrode metal layer as the multilayer structure, and providing the adherence metal layer of the same metal as the first electrode metal layer at the lowest layer, and also providing the noble metal layer of Au and/or Pt at the top part of the highly conductive metal layer; the product with a low contact resistance can be stably obtained with good repeatability. By placing the adherence metal layer at the lowest layer, the metal constituting the adherence metal layer and the metal constituting the first electrode metal layer (after the first heat treatment) becomes one body by mixing due to the second heat treatment; thereby this is thought to be an one factor to increase the adhesion strength. Note that, when the noble metal layer is not provided, due to the second heat treatment, a relatively large air space (void) is easily formed at the boundary between the first electrode metal layer and the second electrode metal layer and near thereof. On the contrary to this, when the noble metal layer is formed, such voids are barely seen. According to this, the above mentioned noble metal which easily diffuses at the high temperature fills in the air space (void) by diffusing during the second heat treatment, thereby it is thought that the repeatability has significantly enhanced.

BRIEF DESCRIPTION OF THE DRAWINGS

FIG. 4 is a result of TEM-EDX analysis of the n-type contact electrode cross section obtained at the comparative example 1.

DETAILED DESCRIPTION OF THE INVENTION

Figure 1:
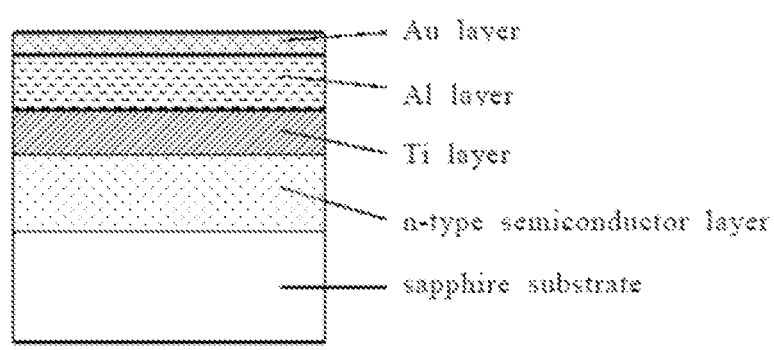
FIG. 1 is a schematic figure showing the structure of the n-type contact electrode described in the Patent article 1.
Figure 2:
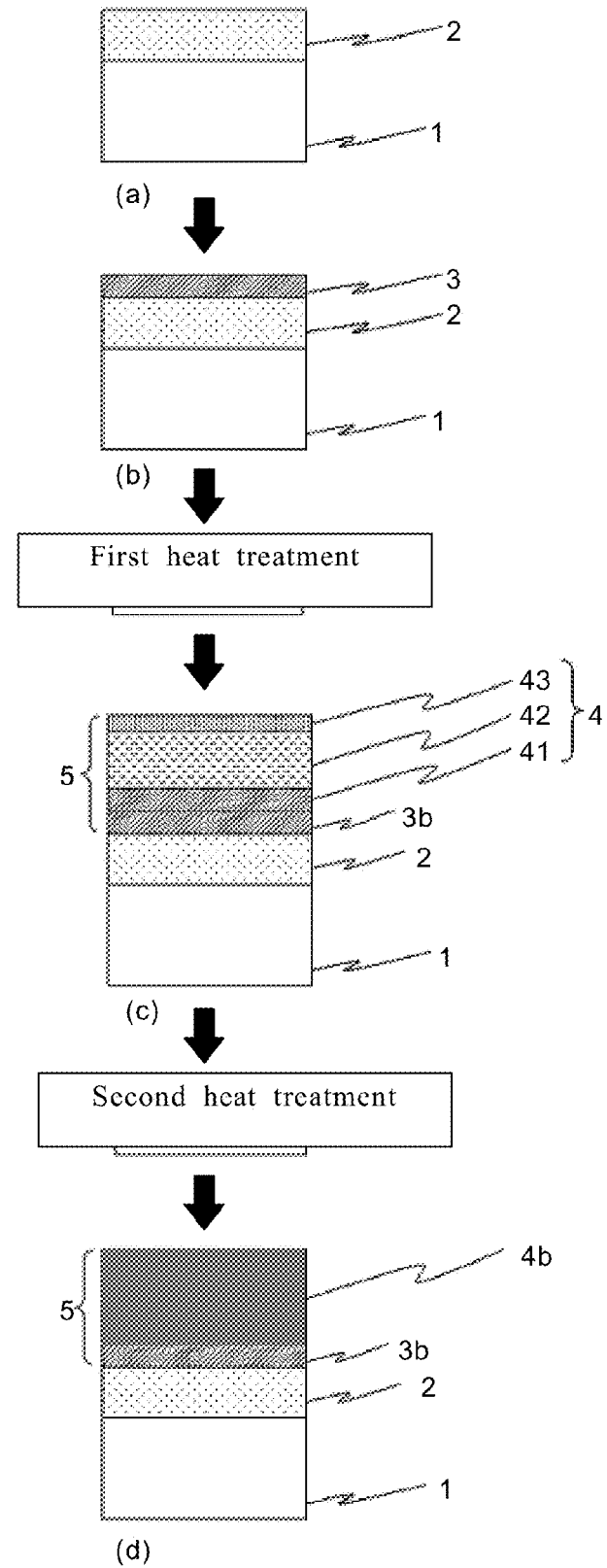
FIG. 2 is a step showing the formation of the n-type contact electrode at the example 1.

The present invention is a method for forming the n-type contact electrode on the n-type semiconductor layer of the group III nitride single crystal layer. Specifically, it is a method for forming the n-type contact electrode including the steps of carrying out the heat treatment at the temperature of 800° C. or higher and 1200° C. or less after forming the first electrode layer on the n-type semiconductor layer of the group III nitride single crystal layer, and carrying out the heat treatment step at the temperature of 700° C. or higher and 1000° C. or less after forming the second electrode metal layer on said first electrode metal layer. Hereinafter the present invention will explained in steps by using FIG. 2 showing the steps which is suitable one embodiment of the present invention.

(The n-Type Semiconductor Layer of the Group III Nitride Single Crystal Layer (the Preparation of the n-Type Semiconductor Layer))

In the present invention, the n-type semiconductor layer of the group III nitride single crystal can be produced by a known method. Note that, the group III nitride in the present invention is those satisfying the composition shown by general formula of $Al_xIn_yGa_zN$ (x, y, and z are rational numbers satisfying $0<x\leq1.0, 0<y<0.1, 0<z<1.0$; and $x+y+z=1.0$). Note that, in order to make the group III nitride into a n-type semiconductor, the n-type impurities (the donor) such as silicon (Si), germanium (Ge) must be doped to usually $1\times10^{17}$ to $1\times10^{19}$ (atom/cm$^3$), or preferably to $5\times10^{17}$ to $5\times10^{18}$ (atom/cm$^3$); however the concentration of these impurities are not considered in the above compositional formula.

The composition or the constitution of said n-type semiconductor layer may be determined according to the use. For example, as shown in FIG. 2 ((a) of FIG. 2), said n-type semiconductor layer 2 may be formed on the single crystal layer substrate 1 such as sapphire substrate or on the layered body formed with one or more layers of the group III nitride semiconductor layer (the group III nitride single crystal layer) having different composition on said substrate 1. Also, as the n-type semiconductor layer 2, Si may be included as the dopant. Note that, the thickness of said substrate 1 and the n-type semiconductor layer 2 may be determined according to the use or the application. The thickness of the n-type semiconductor layer 2 is usually 0.5 to 5.0 μm.

Such n-type semiconductor layer, for example, can be formed by a metal organic chemical vapor deposition method (MOCVD method). Specifically, by using the commercially available machine, the group III source gases, for example the metal organic gas such as trimethylaluminum or so, the nitrogen source gas for example an ammonium gas or so are supplied on to said single crystal substrate or onto said layered body; thereby the n-type semiconductor layer can be formed. As for the condition for forming the n-type semiconductor layer by said MOCVD method, the known method can be applied.

In the present invention, the n-type semiconductor layer can be formed by following said method. Said n-type semiconductor layer is not particularly limited, and it only needs to be constituted from the group III nitride single crystal shown in said composition. Therefore, the n-type semiconductor layer may be GaN layer. Note that, the method of the present invention exhibits superior effect particularly when the n-type semiconductor layer is constituted from group III nitride single crystal including Al, and constituted from said group III nitride single crystal satisfying the composition shown by $Al_xIn_yGa_zN$ (x, y, and z are rational numbers satisfying $0<x\leq1.0, 0\leq y\leq0.1, 0\leq z<1.0$; and $x+y+z=1.0$).

The electron affinity of such group III nitride single crystal layer including Al becomes small as the content of Al increases. At this time, the Schottky barrier when contacting the metal enlarges, and the low contact low resistance becomes difficult to obtain and also the ohmic contact becomes difficult to obtain. In the method of the present invention, a superior effect can be obtained, even when the n-type semiconductor layer is of the group III nitride single crystal with high content ratio of Al which is difficult to obtain the good contact resistance value.

Therefore, in the present invention, it is preferably applied in case the n-type semiconductor layer is of the group III nitride single crystal with the high content of Al. Specifically, it is suitably used when the n-type semiconductor layer is constituted from the group III nitride single crystal satisfies the composition shown by $Al_xIn_yGa_zN$ (x, y, and z are rational numbers satisfies $0<x\leq1.0, 0\leq y\leq0.1, 0\leq z<1.0$; particularly of $0.5\leq x\leq1.0, 0\leq y\leq0.1, 0\leq z\leq0.5$; and $x+y+z=1.0$). Among the group III nitride single crystal having high content of Al, the method of the present invention is particularly suitably used in case the n-type semiconductor layer of the group III nitride single crystal having preferably x of 0.5 or more, and particularly preferably x of 0.6 or more. Note that, in this case, y may be 0 or more and 0.1 or less, however y is particularly preferably 0.

In the present invention, the contact electrode is formed on above mentioned n-type semiconductor layer of the group III nitride single crystal. In the method of the present invention, the contact electrode is formed by plurality of steps; however said n-type semiconductor layer can be surface treated before forming the contact electrode. Usually, when producing the group III nitride semiconductor element, p-type semiconductor layer is further layered on the n-type semiconductor layer of which the n-type contact electrode is formed. Then, a part of this p-type semiconductor layer is removed by etching treatment (for example by a dry etching treatment by the halogen gas such as chlorine based gas including the chlorine atom, or fluorine based gas including the fluorine atom or so), followed by forming the p-type contact electrode on the remaining p-type semiconductor layer, and then forming the n-type contact electrode on the n-type semiconductor layer being exposed by the etching treatment. The method of the present invention can be effectively used when the n-type contact electrode is formed on the n-type semiconductor layer which is exposed by such method. Furthermore, it may be effectively used in case of forming the contact electrode on the n-type semiconductor layer carried out with the surface treatment by the acid solution or the alkaline solution after the above mentioned dry etching treatment. Of course, the present invention can be effectively used in case of forming the contact electrode on the n-type semiconductor layer which is not carried out with the above mentioned dry etching treatment and only carried out with the surface treatment by the acid solution or the alkaline solution. By said surface treatment, it can remove the damage layer of the n-type nitride semiconductor layer caused by the dry etching treatment, or the oxidized membrane, hydroxide membrane of the n-type semiconductor surface. Next, this surface treatment will be explained.

First, the method of surface treatment by the acid solution will be explained. Next, as for the acid solution being used, an inorganic acid solution such as hydrochloric acid, hydrofluoric acid, aqua regia or so, and an organic acid solution such as boron trifluoride etherate or so can be used. These acid solutions have an effect to remove the natural oxidized membrane or the hydroxide membrane which are formed on the n-type semiconductor surface of the group III nitride single crystal. The concentration, the temperature of the acid solution and the treating time (the immersing time in the acid solution) may be suitably optimized depending on the chemical solution being used. As for the method of the surface treatment, the method of immersing the substrate in said acid solution can be mentioned. As for the most preferable embodiment, the n-type semiconductor layer of the group III nitride single crystal is preferably surface treated by immersing in the inorganic acid solution having a concentration of 10 wt % or more and 40 wt % or less, at the temperature of 50° C. or higher and below the boiling point of said solution and preferably 70° C. or higher and 100° C. or less for 1 minute or more and 20 minutes or less.

Next, the method of surface treating by the alkaline solution will be explained. As for the alkaline solution being used, an inorganic alkaline solution such as potassium hydroxide solution, sodium hydroxide solution or so, and a organic alkaline solution such as tetra methyl ammonium hydroxide (TMAH) solution or so can be used. When these alkaline solution are used, it is thought that there is an effect of wet etching the n-type semiconductor layer of the group III nitride single crystal. The concentration and the temperature of the alkaline solution and the treating time (the immersing time in the alkaline solution) can be suitably optimized depending on the chemical solution used. As for the method of the surface treating, the method of immersing the substrate in said alkaline solution may be mentioned. As for the most preferable embodiment, it is preferable to surface treat the n-type semiconductor layer of the group III nitride single crystal by immersing in the inorganic alkaline solution having a concentration of 10 wt % or more and 20 wt % or less, at the temperature of 50° C. or higher and below the boiling temperature of said solution, particularly 70° C. or higher and 100° C. or less for 1 minute or more and 20 minutes or less.

Among the above mentioned surface treatment, in order to form a n-type contact electrode having further good contact resistance value, it is preferable to carry out the surface treatment by the alkaline solution. Particularly, when forming the contact electrode on the n-type semiconductor layer of the group III nitride having high content of Al and satisfying the above mentioned composition, the high effect of the low contact low resistance can be obtained under a milder condition of the surface treatment by the alkaline solution compared to that of the acid solution. It is not clear why a superior effect can be obtained by carrying out the surface treatment by the alkaline solution; however it is thought because said alkaline solution has a strong etching effect against the nitrides. Also, the surface treatment by the alkaline solution can efficiently remove the damage layer by the plasma formed by the dry etching, thus the present invention can be particularly preferably used for forming the contact electrode on the n-type semiconductor layer carried out with the surface treatment by the alkaline solution after the dry etching treatment.

The present invention carries out the heat treatment at the temperature of 800° C. or higher and 1200° C. or less after forming the first electrode metal layer 3 on the n-type semiconductor layer which has been surface treated by said method if needed. Next, the method of forming the first electrode metal layer 3 will be explained.

(The Method for Forming the First Electrode Metal Layer 3)

In the present invention, as for the method for forming the first electrode metal layer on said n-type semiconductor layer, the known method for forming the electrode metal layer can be applied.

As for the specific method for forming the first electrode metal layer 3, the method of forming the metallic membrane on the surface of said n-type semiconductor layer 2 by the electron beam evaporation method can be mentioned. The pressure inside the chamber when evaporating the metal membrane is preferably $1.0 \times 10^{-3}$ Pa or less in order to reduce the influence of the impurities or so. By such method, as shown in FIG. 2 ((b) of FIG. 2), the first electrode metal layer 3 can be formed on the n-type semiconductor layer 2.

In the present invention, the metal constituting the first electrode metal layer 3 is at least one selected from the group consisting of Ti, V, and Ta. These metals are active against the group III nitride containing Al, and have a common property that it forms a nitrides under the reaction at high temperature. Therefore, by the heat treatment described in the following, the first layer 3b is formed from the first electrode metal layer 3, and at the boundary between the n-type semiconductor layer 2, the layer (the reaction layer) of the nitride of said metals such as titanium nitride (TiN), vanadium nitride (VN), tantalum nitride (TaN) or the composite nitride of Al and said metals are formed, and the electron lacking layer is made thin (the width of the Schottky barrier is made narrow); thereby the boundary condition allows to exhibit the tunnel effect, and thus it is speculated that the contact resistance value became low. The first electrode metal layer 3 is most preferably constituted from Ti considering the relation between the second electrode metal layer 4 which will be described in the following. Note that, when the n-type semiconductor is GaN, Ti may be used as the electrode metal, however GaN has high thermal decomposition property, and since the heat treatment after the formation of the electrode is 400 to 600° C. or so, the reaction layer is thought to be barely formed.

Note that, in the example of the present invention which will be described in the following, the embodiment using Ti as the first electrode metal layer 3 is mentioned; however it is thought that the same effect can be obtained incase of using V or Ta according to the similarities shown by "JOURNAL OF ELECTRONIC MATERIALS, Vol. 37, No. 5, 2008", "JOURNAL OF APPLIED PHYSICS 100, 046 106 (2006)" or so.

In the present invention, the thickness of the first electrode metal layer 3 is not particularly limited; however it is preferably 10 nm or more. By the thickness of the first electrode metal layer 3 satisfying the above mentioned range, even if the metal diffuses due to the second heat treatment which will be described in the following, the entire n-type semiconductor layer 2 can be covered by the first electrode metal layer 3 (the first layer 3*b*); thereby a good contact resistance value can be obtained. Also, the upper limit of the thickness of the first electrode metal layer 3 is not particularly limited; however it is 50 nm or so considering the productivity and the economic efficiency.

In the present invention, after forming the first electrode metal layer 3 on the n-type semiconductor layer by said method, the heat treatment is carried out at the temperature of 800° C. or higher and 1200° C. or less and the first layer 3*b* is obtained. Next, this heat treatment (the first heat treatment) will be explained.

(The First Heat Treatment)

In the present invention, by carrying out the first heat treatment, a superior effect is exhibited. If this heat treatment is not carried out, the reaction layer which effectively reduce the width of the Schottky barrier at the boundary can not be formed, and also the bonding between the first layer 3*b* obtained from the first electrode metal layer 3 and the n-type semiconductor layer becomes insufficient, thus a good contact resistance value cannot be obtained.

The present invention exhibits superior effect by carrying out the first heat treatment. When said temperature is below 800° C., not only that the formation of the reaction layer becomes insufficient, but also the bonding between the first layer 3*b* and the n-type semiconductor 2 declines thus it is not preferable. On the other hand, when the temperature exceeds 1200° C., the thermal decomposition of the n-type semiconductor layer 2 may occur thus it is not preferable. Considering the bonding strength of the n-type semiconductor layer 2 and the first layer 3*b*, and the thermal decomposition of the n-type semiconductor layer 2, the temperature of the first heat treatment is preferably 800° C. or higher and 1100° C. or less. Note that, the temperature of the heat treatment may be a constant temperature as long as it is within the above range, or it may change within said range. Also, when the temperature changes within said range; the comparison between the temperatures of the heat treatment after forming the second electrode metal layer 4 can be made by comparing the average value.

In the present invention, the time of the first heat treatment may be determined depending on the composition of the n-type semiconductor layer 2, the type and the thickness of the first electrode metal layer 3; however it is preferably carried out for 30 seconds or more and 90 seconds or less.

Note that, the time of the heat treatment does not include the time of the temperature rising step. The shorter the temperature rising time is, the more preferable it is; however it is influenced by the capacity, the ability, of the device and the heat treatment temperature or so; hence usually 120 seconds or less is preferable, and more preferably 60 seconds or less. The shortest time of the temperature rising time can not be determined as it is significantly influenced by the ability of the device; however usually it is 10 seconds.

In the present invention, the first heat treatment is not particularly limited; however it is preferably carried out under the inactive gas atmosphere, for example such as under the nitrogen atmosphere, in order to prevent the unfavorable reaction with the n-type semiconductor layer.

Such first heat treatment can be carried out by using the RTA (Rapid Thermal Annealing: instantaneous heat treatment) device which is used usually when forming the n-type contact electrode.

Note that, by the above mentioned first heat treatment, the first layer 3*b* is formed on the n-type semiconductor layer of the n-type contact electrode of the present invention. The first layer 3*b* is a heat treated product of said first electrode metal layer 3, and a thin reaction layer is formed (the thickness being several nm or so, or less than that) at the interface between the n-type semiconductor layer; and the metal layer including at least one metal selected from the group consisting of Ti, V and Ta is present thereon. Note that, the nitride of the above mentioned metal such as Ti or so is frequently mixed in said metal layer. The first layer 3*b* formed by the first heat treatment, particularly the reaction layer thereof is thought to function as the barrier layer preventing the metal such as the specific highly conductive metal, Au, Pt from moving by diffusing into the n-type semiconductor layer at the second heat treatment, which is thought to be the effect due to the above mentioned metal nitride.

In the present invention, after carrying out the first heat treatment, the second electrode metal layer 4 is formed on the first electrode metal layer after the first heat treatment, that is on the first layer 3*b*, then the heat treatment is carried out at the temperature of 700° C. or higher and 1000° C. or less.

(The Method for Forming the Second Electrode Metal Layer 4)

In the present invention, the method for forming the second electrode metal layer 4 on the first electrode metal layer (the first layer 3*b*) after carrying out said first heat treatment can use the known method for forming the electrode metal layer as same as the method for forming the first electrode metal layer. Specifically, the method of forming the metal film by electronic beam evaporation method to the surface of said first layer 3*b* can be mentioned. The pressure inside the chamber when evaporating the metal film is preferably $1.0 \times 10^{-3}$ Pa or less in order to reduce the influence of the impurities or so. By such method, the second electrode metal layer 4 can be formed on the first layer 3*b* as shown in FIG. 2 ((c) of FIG. 2).

This second electrode metal layer 4 includes the metal layer (the highly conductive metal layer) of the metal having a work function of 4.0 eV to 4.8 eV, and the specific resistance of $1.5 \times 10^{-6}$ Ω·cm to $4.0 \times 10^{-6}$ Ω·cm. Generally, the work function of the metal may slightly differ depending on the measuring method and the reference article; however the present invention will refer to the work function cited in JAP__48__4729(1977). By forming and heat treating the metal layer of the specific highly conductive metal as the second electrode metal layer after the first heat treatment, the boundary status obtained in the first heat treatment is maintained, and the highly conductive metal connects without increasing the Schottky barrier, hence the contact resistance can be made low. As for the specific highly conductive metal, Al (the specific resistance of $2.65 \times 10^{-6}$ Ω·cm, and the work function of 4.28 eV), Ag (the specific resistance of $1.59 \times 10^{-6}$ Ω·cm, the work function of 4.26 eV), Cu (the specific resistance of $1.92 \times 10^{-6}$ Ω·cm, and the work function of 4.65 eV) or so may be mentioned; however it is preferable to use Al since a significant effect can be obtained in a low cost.

These second electrode metal layer 4 can be made only from the layer consisting the specific highly conductive metal layer (the highly conductive metal layer); however it preferably has a multilayer structure. For example, it is preferable to include the adherence metal layer of at least one metal selected from the group consisting of Ti, V, and Ta since it improves the connection with the first layer 3b, and the adherence metal layer is further preferably placed at the lowest layer of the multilayer structure. Also, it is preferable to include the noble metal layer of Au and/or Pt since the contact resistance can be made stably low and the ohmic resistance can be attained; and further preferably the noble metal layer is preferably placed at the upper layer than the highly conductive metal layer. As for the most preferable embodiment of the second electrode metal layer 4, the embodiment having a multilayer structure including said adherence metal layer, said highly conductive metal layer and said noble metal layer, wherein said adherence metal layer is placed at the lowest layer of said multilayer structure, and said noble metal layer is placed at the upper layer than said highly conductive metal layer may be mentioned, since the above mentioned two effects can be obtained simultaneously.

Note that, at the second heat treatment, Ni (the specific resistance of $6.2 \times 10^{-6}$ Ω·cm, and the work function of 5.15 eV) layer may be formed directly under said noble metal layer in order to regulate the diffusion of said noble metal and without interfering the void prevention function (fill the void), thereby further securely prevent the noble metal from contacting with the n-type semiconductor layer by diffusing.

In the present invention, this second electrode metal layer 4 may be formed from one layer of the metal film; however in order to make the n-type contact electrode having further enhanced ability, it is preferable to have a metal multilayer structure having two or more layers of the metal depending on the purpose as mentioned in the above. The suitable layer structure of the second electrode layer 4 is shown in FIG. 2 ((c) of FIG. 2). By explaining further in detail using (c) of FIG. 2, the first metal film 41 (the adherence metal layer) of Ti or so is formed on said first layer 3b, and the second metal film 42 (the highly conductive metal layer) of Al or so is formed on said metal film 41, then the third metal film 43 (the noble metal layer) of Au or so is formed on said metal film 42. Note that, although it is not shown in the figure; as described in the above, Ni layer may be provided at the lower layer of the above mentioned third metal film 43.

The thickness of the second electrode metal layer 4 is not particularly limited, and it may be 20 nm or more. Note that, the upper limit of the second electrode metal layer 4 thickness can not be limited as the optimum thickness differ depending on the multilayer structure and the type of the metal constituting; however it is 200 nm considering the productivity and the economical efficiency. In case it is a multilayer structure, the total thickness preferably satisfies the above mentioned range.

Also, when the second electrode metal layer 4 has the multilayer structure including said adherence metal layer, said highly conductive metal layer and said noble metal layer, each layers preferably satisfy the following range. That is, the thickness of said adherence metal layer is preferably 5 nm or more and 20 nm or less, the thickness of said highly conductive metal layer is preferably 10 nm or more and 120 nm or less, and the thickness of said noble metal layer is preferably 5 nm or more and 60 nm or less. By each layers satisfying the above mentioned ranges, the n-type contact electrode layer 5 can be made low resistance, and also it can be produced with good productivity and economical efficiency.

In the present invention, the second electrode metal layer 4 is formed by the above mentioned method, then the heat treatment is carried out at the temperature of 700° C. or higher and 1000° C. or less to obtained the second layer 4b; thereby the n-type contact electrode is formed.

(The Second Heat Treatment)

In the present invention, by carrying out the second heat treatment, the first layer 3b and the second layer 4b are bonded in good condition, and further the boundary condition between the n-type semiconductor and the first layer 3b or the condition of the second layer 4b can be made in a good condition which allows lowering the contact resistance.

In the present invention, the temperature of the second heat treatment is preferably 700° C. or higher and 1000° C. or less. When the temperature is out of the range, the desired effect cannot be obtained. When considering the bonding of the first layer 3b and the second layer 4b, the bonding of the first layer 3b and the n-type semiconductor layer 2, the temperature of the second heat treatment is preferably 700° C. or higher and 850° C. or less. Also, when forming the contact electrode on the n-type semiconductor layer which is carried out with said surface treatment, this second heat treatment temperature is preferably changed depending on the embodiment of the surface treatment. The reason for this is not clear; however it is thought to be caused by the different surface condition of the n-type semiconductor layer due to the different embodiment of the surface treatment. As for the specific temperature condition, in case the n-type semiconductor layer is surface treated with the acid solution, the temperature of the second heat treatment is 740° C. or higher and 850° C. or less, and further preferably 750° C. or higher and 840° C. or less. On the other hand, in case the surface treatment is carried out by the alkaline solution, the second heat treatment temperature is preferably 700° C. or higher and 850° C. or less, and further preferably 725° C. or higher and 800° C. or less.

Also, in order to maintain the strong bonding between the first layer 3b and the n-type semiconductor layer 2, the second heat treatment temperature is preferably lower than the first heat treatment temperature. Specifically, the second heat treatment temperature is preferably 50° C. or more lower than the first heat treatment temperature. Also, the upper limit of the difference between the first heat treatment and the second heat treatment is not particularly limited; however it is preferably 500° C. or less, and further preferably 250° C. or less.

Note that, this second heat treatment may be a constant temperature as long as it is within said range, or it may change within said range. Also, in case the temperature changes, the comparison between the first heat treatment temperature and the second heat treatment temperature can be done by comparing the average temperatures thereof.

In the present invention, the second heat treatment is not particularly limited; however it is preferably carried out under the nitrogen atmosphere from the point of view of preventing the unfavorable reaction with the n-type semiconductor layer 2, as same as the first heat treatment. Also, the time of the heat treatment is preferably 30 seconds or more and 90 seconds or less from the point of view of the effect and to reduce the damage to the n-type semiconductor layer 2. Note that, the time for said heat treatment does not include the time for the temperature rising step. The shorter the temperature rising time is, the more preferable it is; however it is influenced by the capacity, the ability, of the device and the heat treatment temperature or so; hence usually 120 seconds or less is preferable, and more preferably 60 seconds or less. The shortest time of the temperature rising time can not be determined as it is significantly influenced by the ability of the device; however usually it is 10 seconds.

Such second heat treatment can be carried out by using the RTA (Rapid Thermal Annealing: instantaneous heat treatment) device which is used usually when forming the n-type contact electrode, as same as the first heat treatment.

Note that, by the above mentioned second heat treatment, the second layer 4b is formed on the first layer 3b of the n-type contact electrode of the present invention. The second layer 4b is a heat treatment product of the second electrode metal layer 4, and includes the metal according to its layer structure; however the condition inside the layer significantly changes due to the diffusion and the formation of alloy caused by the heat treatment.

Figure 3:
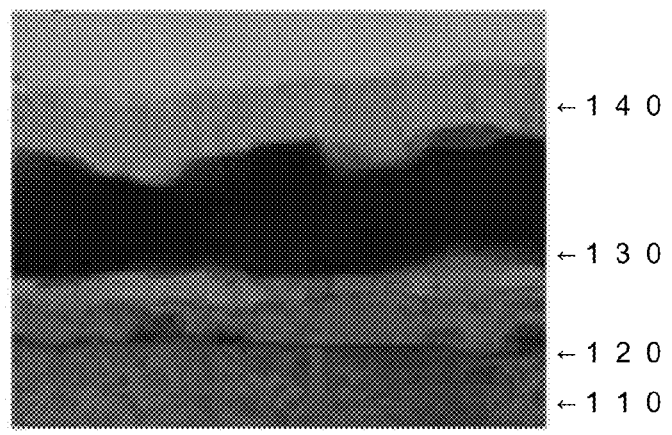
FIG. 3 is a result of the TEM (transmission electron microscope)-EDX (energy dispersive X-ray spectroscopy) analysis of the n-type contact electrode cross section obtained at the example 1.
Figure 3:
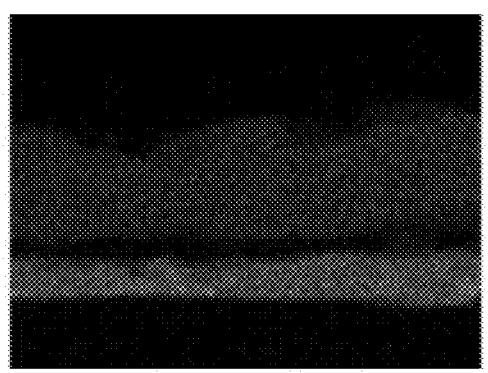
Figure 3:
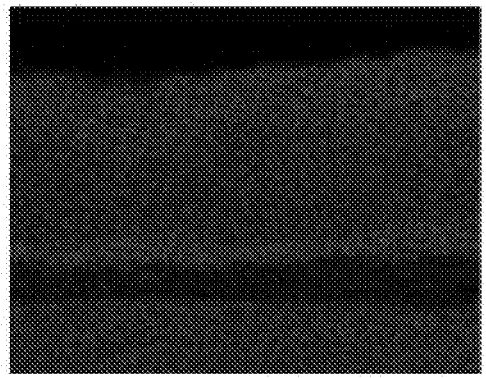
Figure 3:
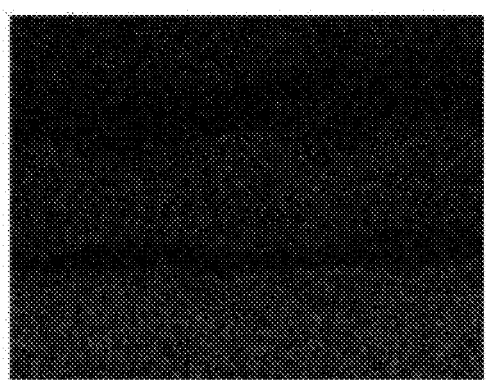
Figure 3:
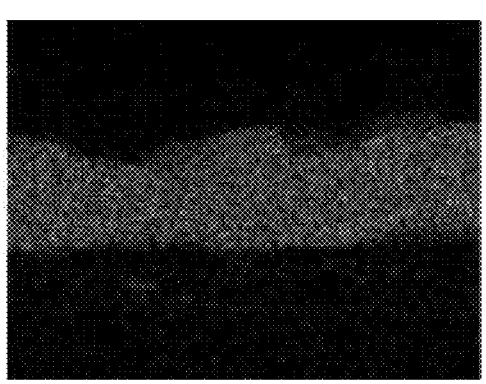

The condition change in the second electrode metal layer 4 at such second heat treatment will be explained taking the example 1, which will be described in the following, as an example; together with the condition change in the first electrode metal layer 3 at the first heat treatment. FIG. 3 shows the TEM-EDX analysis result of the cross section of the n-type contact electrode formed by carrying out the example 1, specifically by carrying out the first heat treatment after forming the Ti layer as the first electrode metal layer 3, then forming the multilayer structure formed with Ti layer (the adherence metal layer), Al layer (the highly conductive metal layer), and Au layer (the noble metal layer) in this order from bottom to top, followed by carrying out the second heat treatment. FIG. 3(a) is a TEM image of the cross section, (b) is an in-plane distribution in said TEM image, and (c) is the in-plane distribution of Al in the same, (d) is the in-plane distribution of N (nitrogen) in the same, and (e) is the in-plane distribution of Au in the same.

As it can be seen from these figures, the Ti layer which is the first layer 3b of after the second heat treatment (that is the first electrode metal layer 3 after the first heat treatment) becomes one body with Ti layer (the adherence metal layer) of the second electrode metal layer 4 of before the heat treatment, and forms the layer 110 having the thickness of 50 nm or so in which Ti and Ti nitrides (for example, TiN) are mixed. Note that, it is well known that TiN is formed when Ti thin film is formed and heat treated on the group III nitride semiconductor of the n-type having high concentration of Al. Therefore, although it is difficult to determine from FIG. 3, there is almost no doubt that an extremely thin TiN layer (the reaction layer) is formed at the boundary between said layer 110 and the n-type semiconductor in the present embodiment as well. Also, on the layer 110, the layer 120 is formed of almost only Al having the thickness of 20 nm or so which is formed by diffusion move of Al, and further thereon, the layer 130 is formed having thickness of 120 nm or so including Au, Al and Ti (small amount of TiN is thought to be mixed therewith) formed by the diffusion move of Au. Note that, in other view which is not shown in the figure, said layer 120 were partially torn, and the portion where said layer 130 was directly contacting on said layer 110 was observed. Further on said layer 130, the layer 140 having the thickness of 30 nm or so of almost only Al is formed as the upper most layer. Note that, in FIG. 2(d), for convenience, the first electrode metal layer of after the heat treatment (the first layer 3b) and the second electrode metal layer of after the heat treatment (the second layer 4b) are shown each separately. Note that, in reality, as mentioned in the above, the first layer 3b and a part of the second layer 4b form the layer like layer 110.

Note that, the structure of the n-type contact electrode obtained as same as the example 1 except for using the second electrode metal layer which does not form the noble metal layer, has a three layer structure of Ti layer including TiN, and the layer almost only of Al and Al layer including Ti (and TiN) from the n-type semiconductor side. Also, it was same as the example 1 in that Al metal did not directly contact with the n-type semiconductor. However, in the above embodiment which does not form the Au layer, the air space (void) was observed at the Al layer including Ti (and TiN). In such embodiment, there is a problem that a repeatability of the low contact low resistance is low, on the other hand, no such void was observed in example 1 in which Au layer was formed, and the low contact low resistance can be attained in good repeatability. According to such fact, it is thought that the repeatability declines due to the formation of the void. Also, in case the noble metal layer which easily diffuses like Au is formed, it is thought that the generation of the void is suppressed along with the diffusion move of these noble metals during the second heat treatment.

On the other hand, as for the n-type contact electrode obtained by using the first electrode metal layer and the second electrode metal layer as the same constitution of the example 1, and carrying out the second heat treatment without the first heat treatment, the condition was not like in case of example 1 which will be described in below; and Au and Al were mixed in the lowest layer, further not only that these metals were directly in contact with the n-type semiconductor, but also a large air space (void) was observed in the electrode.

In the TEM-EDX analysis result of the cross section of the n-type contact electrode of the above mentioned comparative example 1 is shown in FIG. 4. According to such result, the electrode after the heat treatment basically has structure stacking from bottom to top, Ti layer 210 including TiN, the layer 220 in which Ti (including TiN), Al and Au are mixed, and the layer 230 of Al; however not only that said layer 210 is partially torn and a part exist in which said layer 220 directly contacts with the n-type semiconductor, but also a large air space (void) is formed at said layer 220.

In the present example 1, the above mentioned observation results supports the presumption which was described in the "EFFECTS OF THE INVENTION" together with the fact that the contact resistance is significantly lower compared to the comparative example 1.

(The Group III Nitride Semiconductor)

According to the above mentioned method, the n-type contact electrode metal layer having good ohmic characteristic can be formed on the n-type semiconductor layer. The group III nitride semiconductor obtained thereby can be driven in low voltage, and thus it can be used in the device which is necessary to save energy such as LED device or so.

EXAMPLE

Hereinafter, the present invention will be explained by referring to the figures of the specific examples and the comparative examples; however the present invention is not to be limited thereto.

Example 1

The Preparation of the n-Type Semiconductor Layer

The dry etching treatment was carried out by the chlorine based gas including the chlorine gas to the surface of $Al_{0.7}Ga_{0.3}N$ layer (n-type semiconductor layer 2: thickness 1.5 μm) which is grown by doping Si ($1 \times 10^{18}$ atoms/cm$^3$) on the sapphire substrate 1. Then, said substrate was immersed in the hydrochloric acid having a concentration of 37 wt % at the temperature of 40° C. for 15 minutes; thereby the surface treatment of $Al_{0.7}Ga_{0.3}N$ layer was carried out (FIG. 2(a)).

(The Formation of the First Electrode Metal Layer and the First Heat Treatment)

Onto the $Al_{0.7}Ga_{0.3}N$ layer (the n-type semiconductor layer 2) carried out with the surface treatment, 20 nm of Ti as the first electrode metal layer 3 was formed by electron beam evaporation method (FIG. 2 (b)).

Next, the first heat treatment was carried out under the nitrogen gas atmosphere, and said heat treatment was carried out by the instantaneous heat treatment using the RTA (Rapid Thermal Annealing) device. The heat treatment time was 1 minute, and the first heat treatment temperature was 1000° C. Note that, the temperature rising time to reach 1000° C. was 60 seconds.

(The Formation of the Second Electrode Metal Layer and the Second Heat Treatment)

Next, on the Ti layer formed as said first layer 3b, Ti as the second electrode metal layer 4 (the first metal film 41), Al (the second metal film 42), and Au (the third metal film 43) were sequentially formed by the electron beam evaporation method; and the film thickness were respectively 10 nm, 100 nm, 5 nm (FIG. 2 (c)).

The heat treatment of after the formation of the second electrode metal layer 4 (the second heat treatment) was carried out under the nitrogen gas atmosphere, as same as the first heat treatment, and said heat treatment was carried out by the instantaneous heat treatment using RTA (Rapid Thermal Annealing) device. The heat treatment time was 1 minute, and the heat treatment temperature was 825° C. Note that, the temperature rising time to reach 825° C. was 60 seconds.

The voltage normalization value of the measured result of the current-voltage characteristic of the n-type contact electrode layer 5 produced as such is shown in Table 1. Note that, in the n-type contact electrode obtained in this example 1, the voltage value necessary to obtain 1 mA of the electric current value was 5.0V.

Example 2

The same procedure as the example 1 was carried out except for the heat treatment temperature was 775° C. in the second heat treatment of the example 1. The voltage normalization value of the measured result of the current-voltage characteristic of the n-type contact electrode layer produced as such is shown in Table 1.

Example 3

The same procedure as the example 1 was carried out; except for the heat treatment temperature was 800° C. in the second heat treatment of the example 1. The voltage normalization value of the measured result of the current-voltage characteristic of the n-type contact electrode layer produced as such is shown in Table 1.

Example 4

The same procedure as the example 1 was carried out except for the heat treatment temperature was 850° C. in the second heat treatment of the example 1. The voltage normalization value of the measured result of the current-voltage characteristic of the n-type contact electrode layer produced as such is shown in Table 1.

Example 5

Example 5-1 to 5-12

The n-type contact electrode layer was formed as same as the example 1 except for changing the condition of the surface treatment of the $Al_{0.7}Ga_{0.3}N$ layer (the n-type semiconductor layer 2) to the condition shown in Table 2, and the second heat treatment temperature was changed to 750° C.; and the current-voltage characteristics thereof were measured. The result is shown in Table 2.

Example 6

The same procedure as the example 5-11 was carried out; except for the second heat treatment temperature was 800° C. The voltage normalization value of the measured result of the current-voltage characteristic of the n-type contact electrode layer produced as such is shown in Table 1.

Example 7

The same procedure as the example 5-11 was carried out except for the first heat treatment temperature was 800° C., and the second heat treatment temperature was 750° C. The voltage normalization value of the measured result of the current-voltage characteristic of the n-type contact electrode layer produced as such is shown in Table 1.

Comparative example 1

The same procedure as the example 1 was carried out except for the first heat treatment of the example 1 was not carried out. The result of the measured current-voltage characteristic of the n-type contact electrode layer obtained without carrying out the first heat treatment showed increase in a contact resistance value compared to the example 1. The voltage normalization value of the comparative example 1 is shown in Table 1.

The reason of the increase in the contact resistance value compared to the example 1 is speculated, as described in the explanation of FIG. 4, because in the comparative example 1 the second heat treatment was carried out only, thus the surface of the n-type semiconductor layer couldn't be uniformly covered by TiN, and the air space or the diffused metals formed by the heat treatment exist at the boundary between the n-type semiconductor and the n-type contact electrode layer.

The same procedure was carried out as the example 1 except for the second heat treatment of the example 1 was not carried out. The result of the measured current-voltage characteristic of the n-type contact layer produced as such did not reach 1 mA of the output current value at the 40V voltage range.

As for the reason why the contact resistance has increased as such is thought because the multilayer metal did not form an alloy since the heat treatment was not carried out.

TABLE 1

|  | Voltage (V) | Voltage normalization value |
|---|---|---|
| Example 1 | 5.0 | 1.00 |
| Example 2 | 6.4 | 1.28 |
| Example 3 | 5.2 | 1.04 |
| Example 4 | 6.6 | 1.32 |
| Example 5 | 0.2~3.8 | 0.04~0.76 |
| Example 6 | 1.8 | 0.36 |

TABLE 1-continued

|  | Voltage (V) | Voltage normalization value |
|---|---|---|
| Example 1 | 1.1 | 0.22 |
| Comparative example 1 | 8.0 | 1.60 |
| Comparative example 2 | — | — |

TABLE 2

|  | Treatment solution | Treatment temperature | Voltage | Voltage normalization value |
|---|---|---|---|---|
| Example 5-1 | HCl (37 wt % solution) | 40° C. | 2.1 | 0.42 |
| Example 5-2 |  | 80° C. | 2.2 | 0.44 |
| Example 5-3 |  | 100° C. | 2.8 | 0.56 |
| Example 5-4 | HCl•HNO$_3$ (40 wt % solution) | 40° C. | 2.8 | 0.56 |
| Example 5-5 |  | 80° C. | 2.1 | 0.42 |
| Example 5-6 | HF•NH$_4$ (20 wt % solution) | 40° C. | 2.3 | 0.46 |
| Example 5-7 |  | 80° C. | 3.0 | 0.60 |
| Example 5-8 |  | 100° C. | 3.8 | 0.76 |
| Example 5-9 | KOH (10 wt % solution) | 40° C. | 2.3 | 0.46 |
| Example 5-10 |  | 80° C. | 1.1 | 0.22 |
| Example 5-11 |  | 100° C. | 0.2 | 0.04 |
| Example 5-12 | TMAH (25 wt % solution) | 100° C. | 2.0 | 0.40 | note:
TMAH refers to tetramethylammoniumhydroxide.

As for the index of the contact resistance value, the result of said example 1 to example 7, the comparative examples 1 and 2 are shown in regards with the normalized value of the voltage necessary for obtaining 1 mA of current value (note that, in the comparative example 2, the voltage normalization value is not shown since 1 mA or higher current was not obtained). The normalization of said voltage is calculated by dividing the voltage value measured at the obtained each examples and the comparative examples with the voltage value 5.0 of the example 1. Therefore, the voltage normalization value of the example 1 is 1.0.

REFERENCE OF THE NUMERALS

1 . . . Substrate
2 . . . n-type semiconductor layer
3 . . . first electrode metal layer
3b . . . first layer (the first electrode metal layer of after the heat treatment)
4 . . . second electrode metal layer
41 . . . first metal film
42 . . . second metal film
43 . . . third metal film
4b . . . second layer (the second electrode metal layer of after the heat treatment)
5 . . . n-type contact electrode layer

The invention claimed is:

1. A method for forming a n-type contact electrode on a n-type semiconductor layer of a group III nitride single crystal, wherein said method comprises;
   carrying out a heat treatment at a temperature of 800° C. or higher and 1200° C. or less after forming a first electrode metal layer comprising a metal layer of at least one selected from a group consisting of Ti, V, and Ta on said n-type semiconductor layer, and
   carrying out a heat treatment at a temperature of 700° C. or higher and 1000° C. or less after forming a second electrode metal layer including a highly conductive metal layer of metals having a work function of 4.0 eV to 4.8 eV, and a specific resistance of $1.5 \times 10^{-6}$ Ω·cm to $4.0 \times 10^{-6}$ Ω·cm on said first electrode metal layer.

2. The method for forming the n-type contact electrode as set forth in claim 1, wherein said n-type semiconductor layer is of the group III nitride single crystal satisfying the composition $Al_xIn_yGa_zN$, wherein x, y, and z are rational numbers satisfying $0<x\leq1.0$, $0\leq y\leq0.1$, $0\leq z<1.0$; and $x+y+z=1.0$.

3. The method for forming the n-type contact electrode as set forth in claim 1, wherein said second electrode metal layer further includes a noble metal layer of Au and/or Pt.

4. The method for forming the n-type contact electrode as set forth in claim 1, wherein said second electrode metal layer further includes an adherence metal layer comprising at least one selected from a group consisting of Ti, V and Ta.

5. The method for forming the n-type contact electrode as set forth in claim 1, wherein said second electrode metal layer has a multilayer structure including an adherence metal layer of at least one selected from a group consisting of Ti, V and Ta, a highly conductive metal layer comprising a work function of 4.0 eV to 4.8 eV, and a specific resistance of $1.5 \times 10^{-6}$ Ω·cm to $4.0 \times 10^{-6}$ Ω·cm, and a noble metal layer of Au and/or Pt, and in said multilayer structure, said adherence metal layer is placed at a lowest layer, and said noble metal layer is placed at an upper layer than said highly conductive metal layer.

6. The method for forming the n-type contact electrode as set forth in claim 1, wherein the temperature of the heat treatment after the second electrode metal layer is formed is lower than the temperature of the heat treatment after the first electrode metal layer is formed.

7. The method for forming the n-type contact electrode as set forth in claim 1, further comprising surface treating said n-type semiconductor layer by alkaline solution before forming said first electrode metal layer.

8. A group III nitride semiconductor comprising a n-type contact electrode formed by the method as set forth in claim 1.

* * * * *